United States Patent [19]

Mourou et al.

[11] Patent Number: 4,603,293

[45] Date of Patent: Jul. 29, 1986

[54] MEASUREMENT OF ELECTRICAL SIGNALS WITH SUBPICOSECOND RESOLUTION

[75] Inventors: Gerard Mourou; Kevin E. Meyer, both of Rochester, N.Y.

[73] Assignee: University of Rochester, Rochester, N.Y.

[21] Appl. No.: 593,992

[22] Filed: Mar. 27, 1984

[51] Int. Cl.$^4$ .............................................. G01R 31/00
[52] U.S. Cl. ..................................... 324/96; 324/77 K
[58] Field of Search ........................................ 370/1–4; 350/394, 371, 395, 377, 392, 393, 356; 324/77 K, 77 R, 96, 95

[56] References Cited

U.S. PATENT DOCUMENTS

| 3,313,938 | 4/1967 | Peters | 350/393 |
|---|---|---|---|
| 3,432,222 | 3/1969 | Fleisher | 350/371 |
| 3,556,663 | 1/1971 | Cary | 350/371 |
| 4,166,669 | 9/1979 | Leonberger | 350/356 |
| 4,360,865 | 11/1982 | Yasumura | 324/95 |
| 4,446,425 | 5/1984 | Valdmanis | 324/77 K |
| 4,510,441 | 4/1985 | Yasuda | 350/356 |

OTHER PUBLICATIONS

Valdmanis, "Picosecond Electro-Optic Sampling System", Appl. Phys. Lett., 41(3), Aug. 1982, pp. 211–212.
Valdmanis, "Subpicosecond Electrical Sampling", IEEE Jour. of Quantum Elec., vol. QE19, No. 4, Apr. 1983, pp. 664–667.

C. P. Wen, IEEE Trans. Microwave Theory & Tech., 12/69, pp. 1087–1080.
G. Mourou et al., "Subpicosecond Electro-Optic Sampling Using Coplanar Strip Transmission Lines", Appl. Phys. Lett. 45(5), Sep. 1, 1984, pp. 492–494.

*Primary Examiner*—Michael J. Tokar
*Attorney, Agent, or Firm*—Martin LuKacher

[57] ABSTRACT

Electrical signals are measured (analyzed and displayed) with subpicosecond resolution by electro-optic sampling of the signal in an electro-optic crystal, the index of which changes in response to the electric field produced by the signal, in accordance with the Pockels effect. The crystal is disposed adjacent to a transmission line along which the signals propagate the line may be a coplanar wave guide having a plurality of parallel strips of conductive material on the surface of the crystal. The crystal may be disposed adjacent to and in the fringe field of a line on a substrate, which may be part of an integrated circuit, for measuring signals propagating along the line during the operation of the circuit. A beam of short optical (laser) sampling pulses in the picosecond range is focused so that the region where the beam is confocal is disposed where the field is parallel in the crystal. The confocal region (where the optical wavefront is planar is preferably close to the surface of the crystal and perpendicular to the optical axis of the crystal. The optical pulses transmitted through the crystal are processed to provide a display affording a measurement of the electrical signal.

7 Claims, 6 Drawing Figures

MEASUREMENT OF ELECTRICAL SIGNALS WITH SUBPICOSECOND RESOLUTION

DESCRIPTION

The present invention relates to methods and apparatus for measurement of electrical signals with subpicosecond resolution, and particularly to methods and apparatus for electro-optic sampling of electrical signals with the aid of an electro-optic crystal, the index of refraction of which changes in response to the electrical signal in accordance with the Pockels effect. The invention makes it possible to measure transient electrical signals with subpicosecond resolution, thereby enabling the measurement of electrical signals having bandwidths in the tetrahertz range ($10^{12}$ Hz).

This application is related to the application of Gerard Mourou and Janis A. Valdmanis Ser. No. 593,993 having the same title as this application and filed concurrently herewith.

Sampling of an electrical signal with picosecond temporal resolution has been accomplished with the use of a traveling wave Pockels cell made up of an electro-optic crystal of lithium niobate or lithium tantalate on opposite surfaces of which a microwave strip, transmission line for the signals is provided. This system is described in U.S. patent application Ser. No. 348,127 filed Feb. 12, 1982 in the name of J. A. Valdmanis and G. Mourou and assigned to the same assignee as the present application, now U.S. Pat. No. 4,446,425, issued May 1, 1984. This application has been published under the Patent Cooperation Treaty as International Publication No. WO83/02829 on Aug. 18, 1983. The system is also the subject of an article entitled "Picosecond Electro-optic Sampling System" by J. A. Valdmanis et al., *Appl. Phys. Lett.*, Vol. 41-3, 211, August 1982. It is desirable that only TEM or Quasi-TEM modes of propagation take place in the traveling wave Pockel cell described in the above identified publications. Other modes can result in reflections which increase the noise in the sampling process in the cell and detract from the resolution of the system. The high end frequency cut-off for the TEM modes varies inversely with the thickness of the cell between the strip line conductors. The relationship is $$f(\text{cutoff}) = c/4h \sqrt{e^* - 1},$$

where c is the velocity of light, h is the thickness of the cell between the strip line conductors and $e^*$ is the effective dielectric constant of the crystal material. In order for the cutoff frequency to extend to the tetrahertz range, the thickness of the crystal (h) has to be approximately of the order of 10 micrometers (about 14 micrometers when the effective dielectric constant, $e^*$, is approximately 30). It is impractical to fabricate crystals with such a small thickness. While electro-optical sampling systems using traveling wave Pockel cells are capable measuring signals containing frequencies up to many hundreds of gigahertz, with resolution in the picosecond range, even down to 0.5 picoseconds, it is desirable to even further extend the frequency range and the resolution of such electro-optic samplers. It is also desirable to provide electro-optic sampling where the transmission line is independent of or separate from the crystal. Then signals which are carried by lines, such as conductors on integrated circuit chip substrates, may be measured with high resolution.

It has been discovered in accordance with the invention that the extension of the frequency range and the temporal resolution of electro-optic sampling can be obtained through the use of the fringe field of a transmission line along which the electrical signals to be measured propagate. The crystal is disposed in the field and the optical beam is passed through the crystal oriented so that a component of its optical field is in parallel relationship with the field at a localized, small sampling point in the crystal. The transmission line may be a coplanar transmission line having a plurality of strips of conductive material disposed on a surface of the crystal. The optical sampling beam is focused so that its confocal region, where the optical wave front is planar, preferably is close to the surface and perpendicular to the optical axis of the crystal. Since the coplanar waveguide supports the transmission of electrical signals in the tetrahertz range and can easily be formed on the surface of the crystal, a sampling system of the type described in the above referenced publications is operable to measure signals with a bandwidth expanding to the tetrahertz range and with subpicosecond resolution.

It is therefore an object of the present invention to provide improved methods and apparatus for the measurement of electrical signals by electro-optic sampling of the signals as they propagate along an electro-optic crystal capable of measurements in the subpicosecond range of signals having bandwidths extending to the tetrahertz range.

It is a still further object of the present invention to provide methods and apparatus for measurement of electrical signals which propagate on lines (conductors) of integrated circuits by electro-optic sampling of the fringe field produced by such signals adjacent to the lines with the aid of electro-optic crystal.

The foregoing and other objects, features and advantages of the invention as well as presently preferred embodiments thereof and the best modes presently known for carrying out the invention, will become more apparent from a reading of the following description in connection with the accompanying drawings in which.

Figure 1:
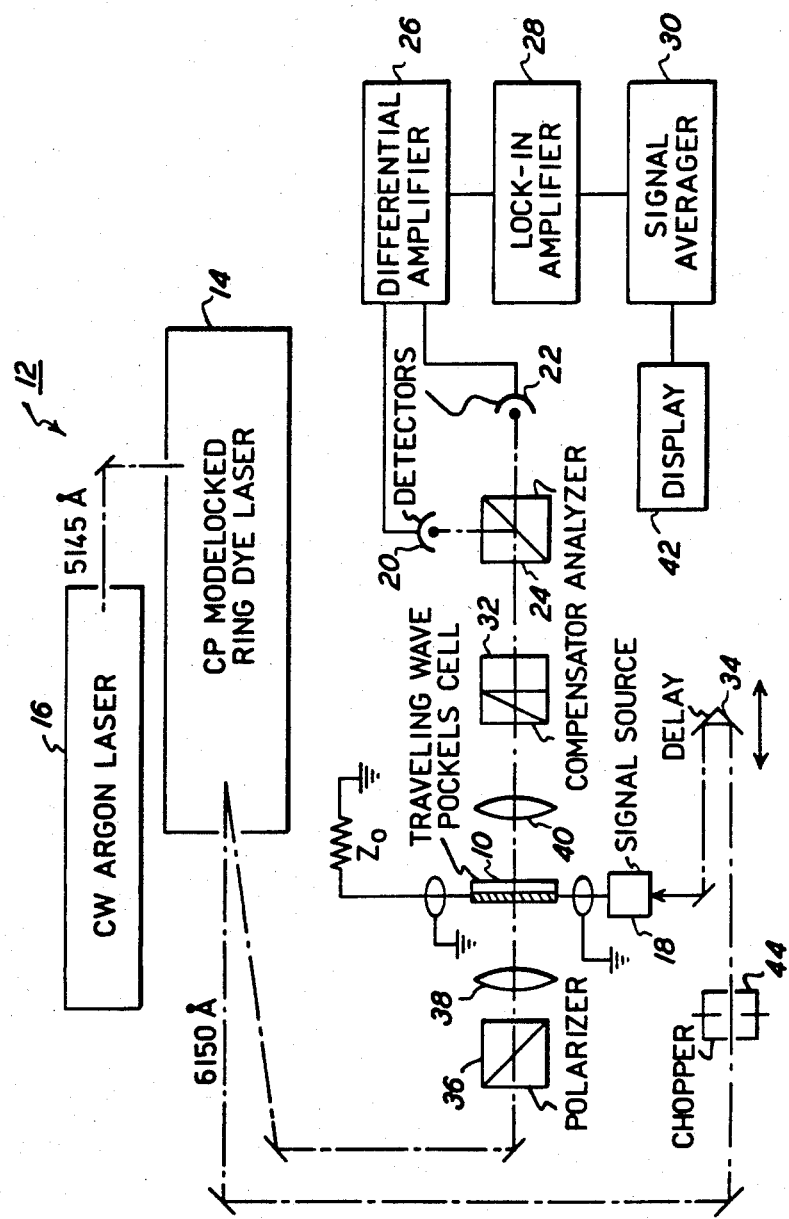
FIG. 1 is a block diagram of an electro-optic sampling system of the type described in the above referenced publications and utilizing a traveling waveguide Pockel cell so as to extend the resolution of the measurement and the high end cutoff frequency of electrical signals which can be sampled and measured.
Figure 4:
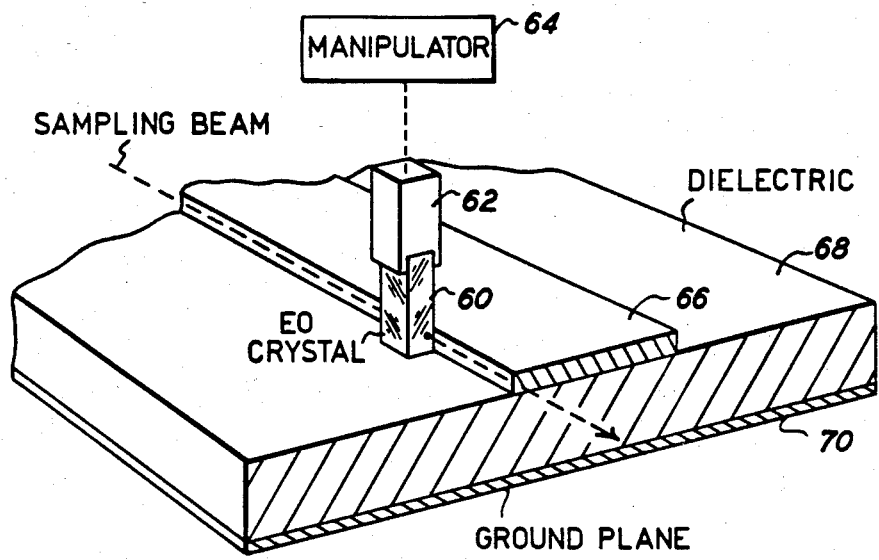
Figure 4A:
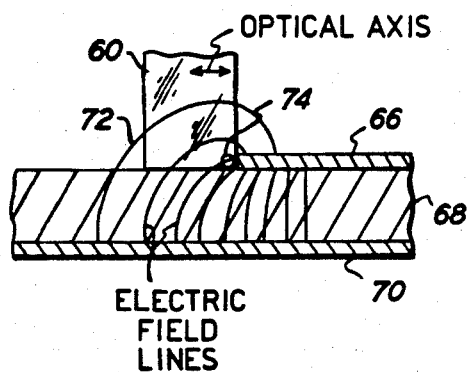
Figure 5:
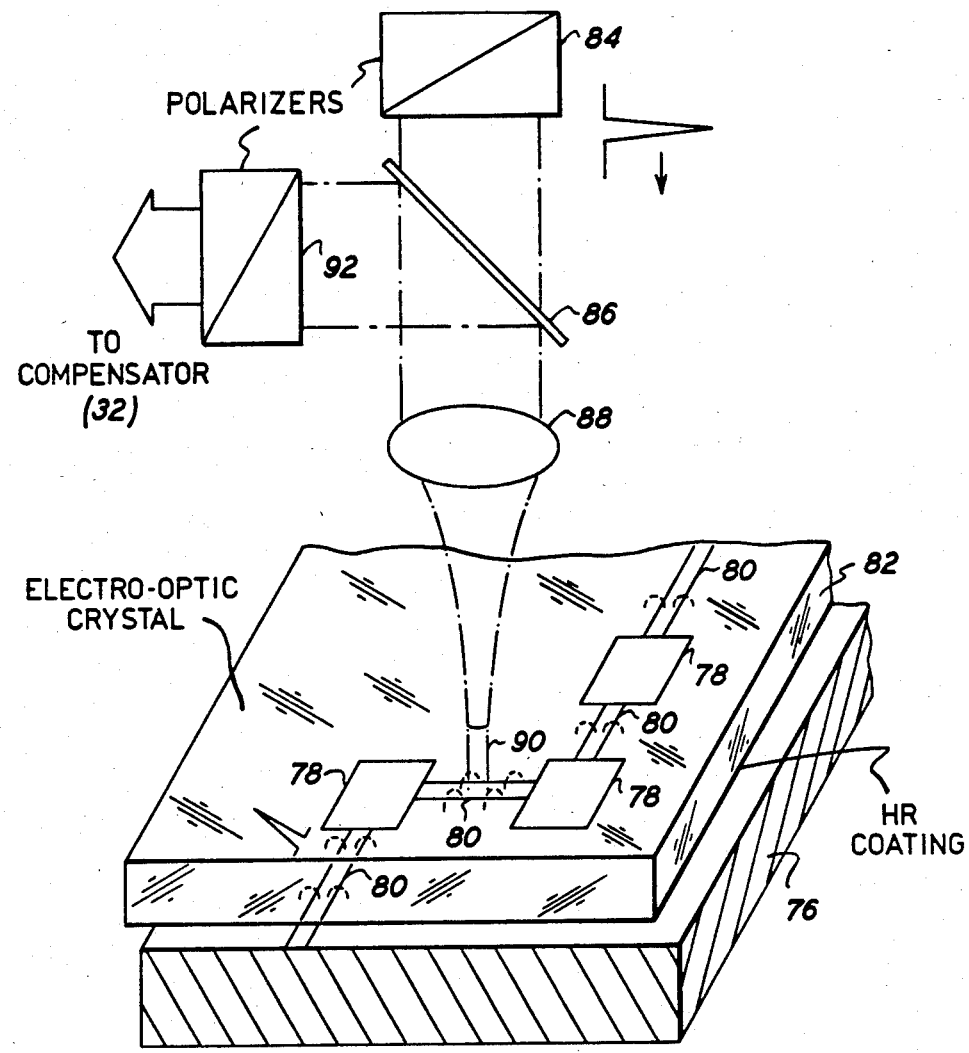

FIGS. 4 and 4a are a perspective and an enlarged sectional view illustrating the measurement of electrical signals using an electro-optic crystal in the fringe field of a micro-strip transmission line which provides a cell for electro-optic sampling of the electrical signal propagated along the micro-strip line using a sampling system such as illustrated in FIG. 1; and FIG. 5 is a perspective view diagramatically illustrating the use of an electro-optic crystal by means of which signals propagating along lines of an integrated circuit may be sampled with the aid of a system such as shown in FIG. 1.

Referring to FIG. 1 there is shown a system of the type described in the above identified publications. Reference may be had to these publications for more detailed description as to the design and operation of the system. Briefly, however, the system uses a traveling wave Pockel cell incorporating a electro-optic crystal of lithium tantalate or lithium niobate; lithium tantalate being presently preferred. This cell may utilize a coplanar waveguide on a surface thereof to provide a traveling wave Pockels cell, as will be described hereinafter in connection with FIGS. 2 and 3. The cell may also be formed by placing the electro-optic crystal adjacent to a transmission line existing on a substrate, such as the microstrip transmission line shown in FIG. 4 and the transmission lines of an integrated circuit, as shown in FIG. 5.

The system utilizing the cell which is shown at 10 in FIG. 1 uses an optical pulse generator 12 made up of a colliding pulse mode-locked laser 14 pumped by a CW argon laser 16. The colliding pulse mode-locked laser is in the form of a ring dye laser. The laser 14 generates very short pulses, for example, 120 femtoseconds (fs) in duration at a 100 MHz rate. These pulses drive an electrical signal source 18 and also synchronously sample the electric field produced by the signal as it propagates across the crystal of the cell 10. Two photodetectors 20 and 22 are used to measure the intensities of the transmitted and rejected beams at an analyzer 24. The signals from the detectors are processed by a differential amplifier 26, a lock-in amplifier 28 and a signal averager 30. The electro-optic sampling process is biased by a compensator 32 at the quarter wave point to achieve linear response and maximum voltage sensitivity. An optical delay device 34 enables temporal scanning of the entire electrical signal profile by the optical probe pulses of light from a polarizer 36 which is focused by a lens 38 in the crystal of the cell 10. Another lens 40 transmits the beam of pulses transmitted through the crystal to the compensator 32 and thence to the analyzer 24. A display 42, such as a CRT display, has its horizontal axis driven linearly with the delay line, and its vertical axis by the output from the signal averager 30. This results in a linear voltage versus equivalent time representation of the unknown electrical signal and requires no further processing. Relatively slow detectors can be used since their necessary bandwidth is dictated only by the frequency of a light chopper 44 used in conjunction with the lock-in amplifier 28.

Figure 2:
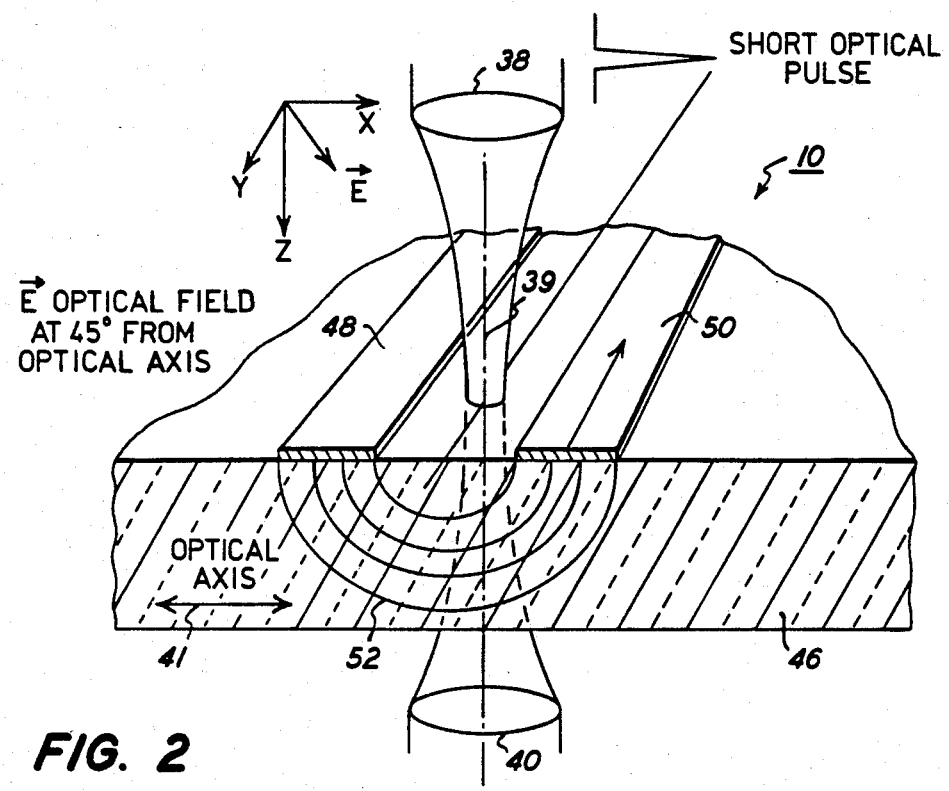
FIG. 2 is a perspective view, diagramatically showing a traveling wave Pockels cell which may be used in the system shown in FIG. 1, in accordance with one embodiment of the invention.

FIG. 2 illustrates the traveling wave cell 10 provided by an electro-optic crystal 46 with two conductive strips 48 and 50, one of which may be grounded, and both of which are disposed on a surface of the crystal 46. The electrical signal from the source may be applied to the coplanar parallel strip transmission line by a coaxial to strip line launcher. One launcher is connected to the source and the other to a terminating impedance ($Z_0$), as shown in FIG. 1. The drawing illustrates the direction of propagation of the signal which is triggered by a pulse from the laser 14 (FIG. 1). The drawing also shows the optical axis of the crystal. The optical pulse laser beam is focused by the lens 38 so that its confocal region is adjacent to the surface of the crystal 46 on which the coplanar strip line conductors 48 and 50 are disposed. The conductors 48 and 50 may be very close together. Through the use of photo-lithographic techniques, the spacing can be extremely small. For example, less than 15 micrometers, spacing can be obtained without difficulty with conventional vapor deposition apparatus and appropriate masks.

The beam size inside the crystal in the confocal region is less than the distance between the strip line conductors 48 and 50. The beam size inside the crystal therefore provides for subpicosecond temporal resolution of the signals. The signals have a fringe field which extends through the crystal. Three lines 52 show the direction of the field. These lines at the focusing poit become parallel to the crystal axis 41 i.e., the optical axis of the crystal on which the strip lines are disposed. The strip lines are oriented so that the field due to the electrical signal is in parallel relationship with the optical axis of the crystal. Considering the confocal region, the wavefronts in that region which are parallel to the beam axis 39 are planar. These planar wavefronts are perpendicular to the optical axis 41.

Figure 3:
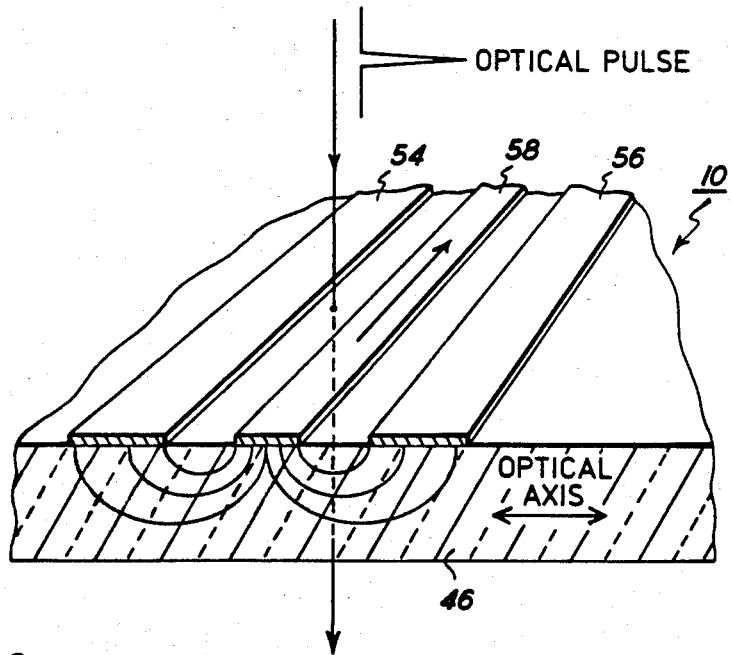
FIG. 3 is a perspective view, diagramatically showing a traveling wave Pockels cell which may be used in the system shown in FIG. 1, in accordance with another embodiment of the invention.

Referring to FIG. 3, the cell 10 shown therein is similar to the cell shown in FIG. 3 except that the coplanar waveguide is made up of three parallel conductive strips 54, 56 and 58. These strips and the crystal 46 constitute a balanced coplanar waveguide. The strips may be disposed close to each other so as to provide a field which is essentially parallel to the optical axis of the crystal 46 close to the surface on which the strips are deposited. Vapor deposition techniques may be used to deposit the strips so as to provide very close spacing therebetween. The two outer strips 54 and 56 serve as ground planes while the strip 58 carries the signal. Launchers may be used to connect the strips at one end of the crystal 46 to the source and at the other end to the terminating impedance. Further information as to such balanced coplanar waveguides may be obtained from an article by C. P. Wen, IEEE Transactions on Microwave Theory and Techniques, December 1969, pages 1087 to 1080.

The laser probe beam is focused as by the lenses 38 and 40 (not shown in FIG. 3 to simplify the illustration) so that its confocal region is between the inner conductor 58 and one of the outer conductors, for example, the conductor 54, as shown in FIG. 3.

Referring to FIG. 4 and 4a there is shown a cell utilizing an electro-optic crystal 60 without conductors on its surface and which is connected through a support 62 to a manipulator 64, suitably a micro-manipulator. The crystal is disposed adjacent to the edge of a microstrip conductor 66 with its end surface bearing upon a substrate 68 on which the micro-strip is deposited. The micro-strip conductor may work opposite a ground plane conductor 70 so as to provide a fringe field as illustrated by the lines 72 in FIG. 4a. The crystal 62 has a region adjacent to the edge of the micro-strip conductor 66. The sampling electro-optic beam is focused in the area indicated by the circle 74 in FIG. 4a such that its optical field has a component parallel to the electric field and preferably, also to the optical axis of the crystal 60. The electrical signal propagates along the microstrip and is sampled in the crystal. The sampling beam goes to the compensator 32 (FIG. 1) and then to the rest of the sampling system so that the signals may be displayed. If a number of conductors are disposed on the substrate 68 the manipulator may be used to bring the crystal adjacent to the edges of these conductors so as to measure the electrical signals which propagate along such other conductors.

Referring to FIG. 5 there is shown a substrate 76 on which integrated circuit components 78, for example active devices such as transistors and/or diodes are disposed. The signals are transmitted between the devices 78 by transmission lines provided by conductors 80. To make measurements of these signals an electro-optic crystal 82 is placed with a surface thereof on the surface of the substrate 76 on which the devices 78 and the conductors 80 are disposed. The field from the conductors then penetrates the crystal. An optical probe beam is generated in the laser and transmits optical pulses to a polarizer 84. These pulses pass through a beam splitter 86 and are focused by a lens 88 to provide a confocal region 90 of the beam in the crystal where the field from one of the transmission lines 80 penetrates the crystal and produces the birefringence. As in the other embodiments, the orientation of the beam is desirably such that a component of the optical field and a component of the electrical field are both parallel to the optical axis of the crystal 82. The surface of the crystal 82, which is juxtaposed on the surface of the substrate on which the devices 78 and the lines 80 are deposited, has a high reflection (HR) coating. Accordingly, the optical beam is reflected from this coating, passes back through the crystal 82, through the focusing lens 88 and is reflected by the beam splitter 86 to a polarization analyzer 92. The output beam then goes to the compensator 32 and the rest of the system shown in FIG. 1. The integrated circuit is operated in sychronism with the optical pulses through the delay 34 so as to develop outputs showing the profile of the electrical signals. The beam splitter 86 may be a polarization sensitive beam splitter which passes one polarization downwardly to the electro-optic crystal 82. The use of the polarizers and beam splitter may be avoided by tilting the beam with respect to the crystal 82 and the substrate 76. The reflected beam will then clear the lens 88 and go on to the compensator.

From the foregoing description it will be apparent that there has been provided improved methods and apparatus for measurement of electrical signals having frequency components of very high frequency, in the tetrahertz range with temporal resolution in the subpicosecond range, both through the use of traveling wave cells having coplanar transmission lines and cells which may be placed adjacent transmission lines to detect the field therethrough. Variations and modifications in the herein described methods and apparatus, within the scope of the invention, will undoubtedly suggest themselves to those skilled in the art. Accordingly, the foregoing description should be taken as illustrative and not in a limiting sense.

We claim:

1. In the method of measuring an electrical signal with subpicosecond resolution with the aid of a transmission line along which said signal propagates which is disposed on an electro-optic crystal adjacent said line so that an electric field is created which passes through at least a portion of said crystal and changes the index of refraction thereof in accordance with the Pockels effect and in which a beam of optical pulses is passed through said crystal in a direction transverse to the direction of said field to optically sample successively occurring portions of said signal, and in which the samples are processed to provide a display of said signal, the improvement comprising depositing a plurality of parallel strips of conductive material forming said line as a coplanar transmission line on the surface of said crystal, and focusing said beam in said crystal near said surface between said strips so that the confocal region where said electric field is parallel to a component of the optical field of said beam are in parallel relationship.

2. The method according to claim 1 wherein said plurality of said strips are three in number, grounding the outer ones of said strips, and applying said signal to the inner one of said strips, and said focusing step is carried out by focusing said beam in said crystal near the surface thereof between said inner and one of said outer ones of said strips.

3. In apparatus for measuring an electrical signal with subpicosecond resolution which signal propagates along a transmission line, said apparatus having an electro-optic crystal through which at least a portion of said field passes and changes the index of refraction of said crystal in accordance with the Pockels effect, said apparatus also having means for generating a beam of optical pulses synchronous with said signal and oriented to pass through said crystal in a direction transverse to the direction of said field to optically sample successively occurring portions of said signal, said apparatus also having means for processing said samples to provide a display of said signal, the improvement comprising a plurality of parallel strips of conductive material forming said line as a coplanar transmission line on a surface of said crystal, and means for focusing said beam in said crystal near said surface between said lines so that the confocal region where said electric field is parallel to a component of the optical field of said beam are in parallel relationship.

4. The apparatus according to claim 3 wherein said plurality of said strips are three in number, the outer ones of said strips being grounded, means for applying said signal to the inner one of said strips, and said focusing means comprising means for focusing said beam in said crystal near the surface thereof between said inner and one of said outer ones of said strips.

5. The apparatus according to claim 3 wherein said crystal has an optical axis, said beam having such orientation with respect to said optical axis that a component of the optical field of said beam is in parallel relationship with said optical axis.

6. The apparatus according to claim 3 including means for orienting said beam and said line with respect to each other so that at least a component of the optical field of said beam and said electric field are in parallel relationship.

7. The apparatus according to claim 6 wherein said line is in a plane parallel to said optical axis and extends in a direction perpendicular to said optical axis so that the optical axis, said electric field and a component of said optical field are in parallel relationship.

* * * * *